(12) United States Patent
Jones

(10) Patent No.: US 8,816,220 B2
(45) Date of Patent: Aug. 26, 2014

(54) ENCLOSURE COOLING APPARATUS

(75) Inventor: Daniel P. Jones, Pinellas Park, FL (US)

(73) Assignee: Raytheon Company, Waltham, MA (US)

( * ) Notice: Subject to any disclaimer, the term of this patent is extended or adjusted under 35 U.S.C. 154(b) by 271 days.

(21) Appl. No.: 13/016,505

(22) Filed: Jan. 28, 2011

(65) Prior Publication Data

US 2012/0193138 A1 Aug. 2, 2012

(51) Int. Cl.
*H05K 7/20* (2006.01)

(52) U.S. Cl.
CPC ..................................... *H05K 7/202* (2013.01)
USPC ........... 174/547; 361/688; 361/689; 361/692; 361/714

(58) Field of Classification Search
USPC .......... 174/547; 361/699, 700, 701, 714, 719, 361/688, 689, 692
See application file for complete search history.

(56) References Cited

U.S. PATENT DOCUMENTS

| | | | |
|---|---|---|---|
| 3,364,912 A | 1/1968 | Dills et al. | |
| 3,596,713 A * | 8/1971 | Katz | 165/104.13 |
| 3,939,382 A | 2/1976 | Lacan et al. | |
| 4,057,101 A * | 11/1977 | Ruka et al. | 165/185 |
| 4,330,812 A * | 5/1982 | Token | 361/720 |
| 4,449,576 A * | 5/1984 | Baum et al. | 165/104.33 |
| 4,473,166 A | 9/1984 | Breiter | |
| 4,531,511 A * | 7/1985 | Hochberg | 126/706 |
| 4,771,365 A | 9/1988 | Cichocki et al. | |
| 5,192,623 A * | 3/1993 | Gewelber | 428/593 |
| D335,280 S | 5/1993 | Schoemer et al. | |
| 5,296,310 A * | 3/1994 | Kibler et al. | 428/614 |
| 5,407,727 A * | 4/1995 | Newell | 428/188 |
| 5,643,238 A * | 7/1997 | Baker | 604/368 |
| 5,795,043 A * | 8/1998 | Johnson et al. | 312/229 |
| 5,831,830 A * | 11/1998 | Mahler | 361/704 |
| 5,876,831 A * | 3/1999 | Rawal | 428/117 |
| 5,939,201 A | 8/1999 | Boire et al. | |
| 6,360,813 B1 * | 3/2002 | Katoh et al. | 165/104.33 |
| 6,515,857 B2 | 2/2003 | Ford et al. | |
| 6,963,490 B2 | 11/2005 | McClary | |
| 2003/0128898 A1 | 7/2003 | Malone et al. | |
| 2004/0078976 A1 * | 4/2004 | Ahn et al. | 29/897.32 |
| 2005/0082035 A1 * | 4/2005 | Debashisu et al. | 165/80.3 |
| 2009/0061147 A1 | 3/2009 | Lippy et al. | |

* cited by examiner

*Primary Examiner* — Timothy Thompson
*Assistant Examiner* — Sherman Ng
(74) *Attorney, Agent, or Firm* — Burns & Levinson LLP; Joseph M. Maraia

(57) ABSTRACT

An enclosure that includes a box structure that includes a plurality of sides defining a sealed chamber for containing a heat producing component. At least one of the sides of the box structure includes a panel. The panel includes two outer sheets and an inner layer of material sandwiched between the two outer sheets. The two outer sheets and the inner layer of material collectively define a plurality of fluid flow channels extending from a first end of the two outer sheets to a second end of the two outer sheets. Heat generated by the heat producing component is transferred to at least one of the outer sheets which transfers the heat to fluid flowing through the fluid flow channels. The panel can be the main load bearing path of the box structure.

15 Claims, 4 Drawing Sheets

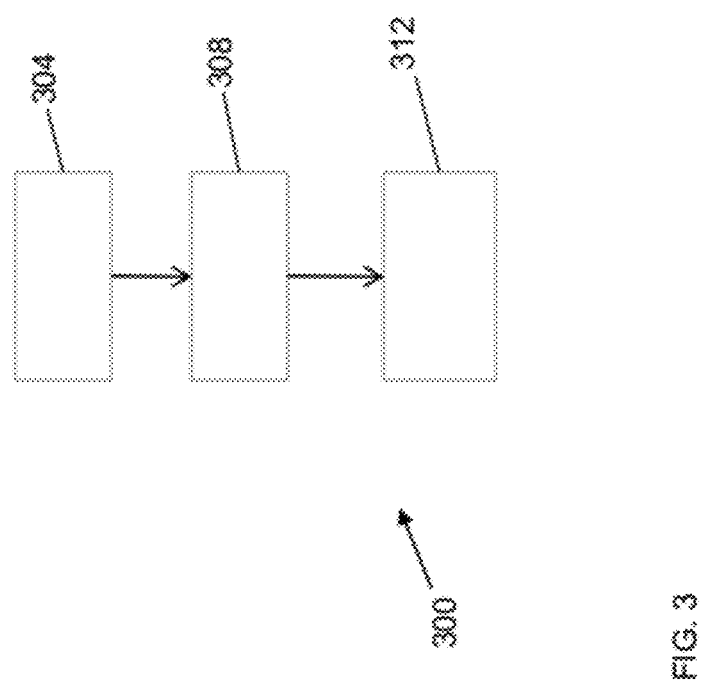

US 8,816,220 B2

ENCLOSURE COOLING APPARATUS

FIELD OF THE INVENTION

The currently described invention relates to systems and methods for controlling the temperature of the contents of an enclosure.

BACKGROUND

Conventional enclosures (e.g., electronics enclosures) are constructed to house/protect and control the temperature of the contents of the enclosure. Separate components are used for each of these functions; resulting in large, heavy enclosure structures. These large, heavy structures pose problems for designers that are tasked with creating lightweight, compact systems for, for example, mobile applications.

A need therefore exists for improved systems where these separate components are combined and methods for cooling the contents of an enclosure are improved while simultaneously minimizing weight increase.

SUMMARY

One embodiment is an enclosure that includes a box structure comprising a plurality of sides defining a sealed chamber for containing a heat producing component, wherein at least one of the sides of the box structure comprises a panel. The panel includes two outer sheets and an inner layer of material sandwiched between the two outer sheets. The two outer sheets and the inner layer of material collectively defining a plurality of fluid flow channels extending from a first end of the two outer sheets to a second end of the two outer sheets. Heat generated by the heat producing component is transferred to at least one of the outer sheets which transfers the heat to fluid flowing through the fluid flow channels. In some embodiments, some of the sides act as the main load bearing path of the box structure.

In some embodiments, the enclosure includes a fan within the enclosure to blow air within the sealed chamber. In some embodiments the fan blows air through the fluid flow channels. In some embodiments, the inner layer of material is a honeycomb core that includes a plurality of columnar cells, wherein the walls of the columnar cells define the fluid flow channels extending from the first end of the two outer sheets to the second end of the two outer sheets.

In some embodiments, one side of the box structure is a radome panel that is transparent to radar and radio waves. In some embodiments, the enclosure includes a thermally conductive adhesive that adheres the two outer sheets to the inner layer of material. In some embodiments, the enclosure includes heat pipes coupling the heat producing component to the panel to transfer heat generated by the heat producing component to the fluid flowing through the fluid flow channels.

In some embodiments, the two outer sheets and the inner layer of material are fabricated using thermally conductive materials. In some embodiments, the heat producing component is an electronic component.

Another embodiment is a method for cooling a heat producing component in an enclosure. The method includes placing a heat producing component in a box structure that includes a plurality of sides defining a sealed chamber, wherein at least one of the sides of the box structure comprises a panel. The panel includes two outer sheets and an inner layer of material sandwiched between the two outer sheets. The two outer sheets and the inner layer of material collectively define a plurality of fluid flow channels extending from a first end of the two outer sheets to a second end of the two outer sheets. Heat generated by the heat producing component is transferred to at least one of the outer sheets.

In some embodiments, the method includes operating a fan within the sealed chamber to blow a fluid through the fluid flow channels to transfer heat from the at least one of the outer sheets to the fluid flowing through the fluid flow channels. In some embodiments, the method includes allowing natural convection to force fluid flow through the fluid flow channels using buoyancy forces. In some embodiments, the method includes transferring heat generated by the heat producing component to the at least one of the outer sheets via heat pipes. In some embodiments, the heat producing component is an electronic component.

Other aspects and advantages of the current invention will become apparent from the following detailed description, taken in conjunction with the accompanying drawings, illustrating the principles of the invention by way of example only.

BRIEF DESCRIPTION OF THE DRAWINGS

The foregoing features of various embodiments of the invention will be more readily understood by reference to the following detailed descriptions in the accompanying drawings, in which:

FIG. 3 is a flowchart of a method for cooling a heat producing component in an enclosure, according to an embodiment.

DETAILED DESCRIPTION OF ILLUSTRATIVE EMBODIMENTS

Figure 1A:
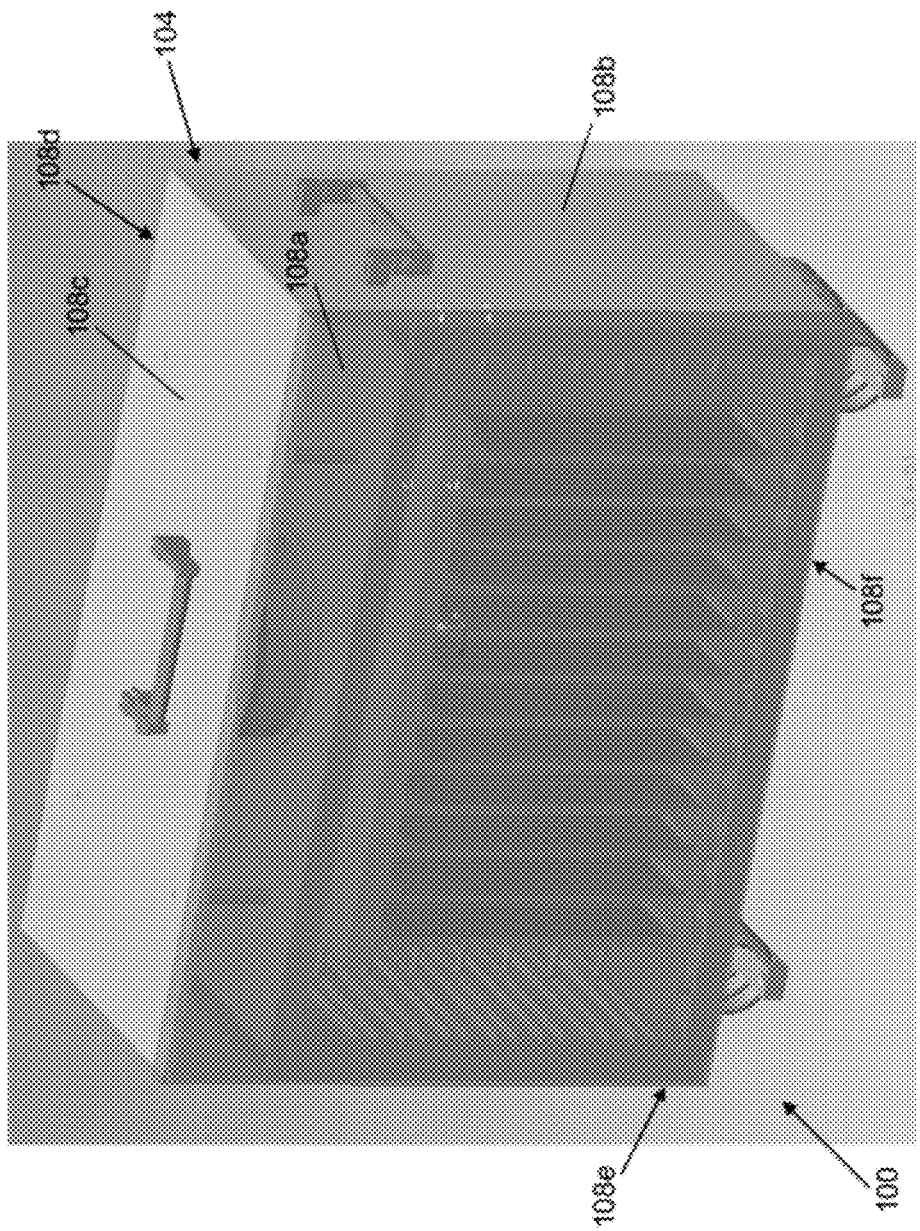
FIG. 1A is a schematic illustration of an enclosure, according to an illustrative embodiment.
Figure 1B:
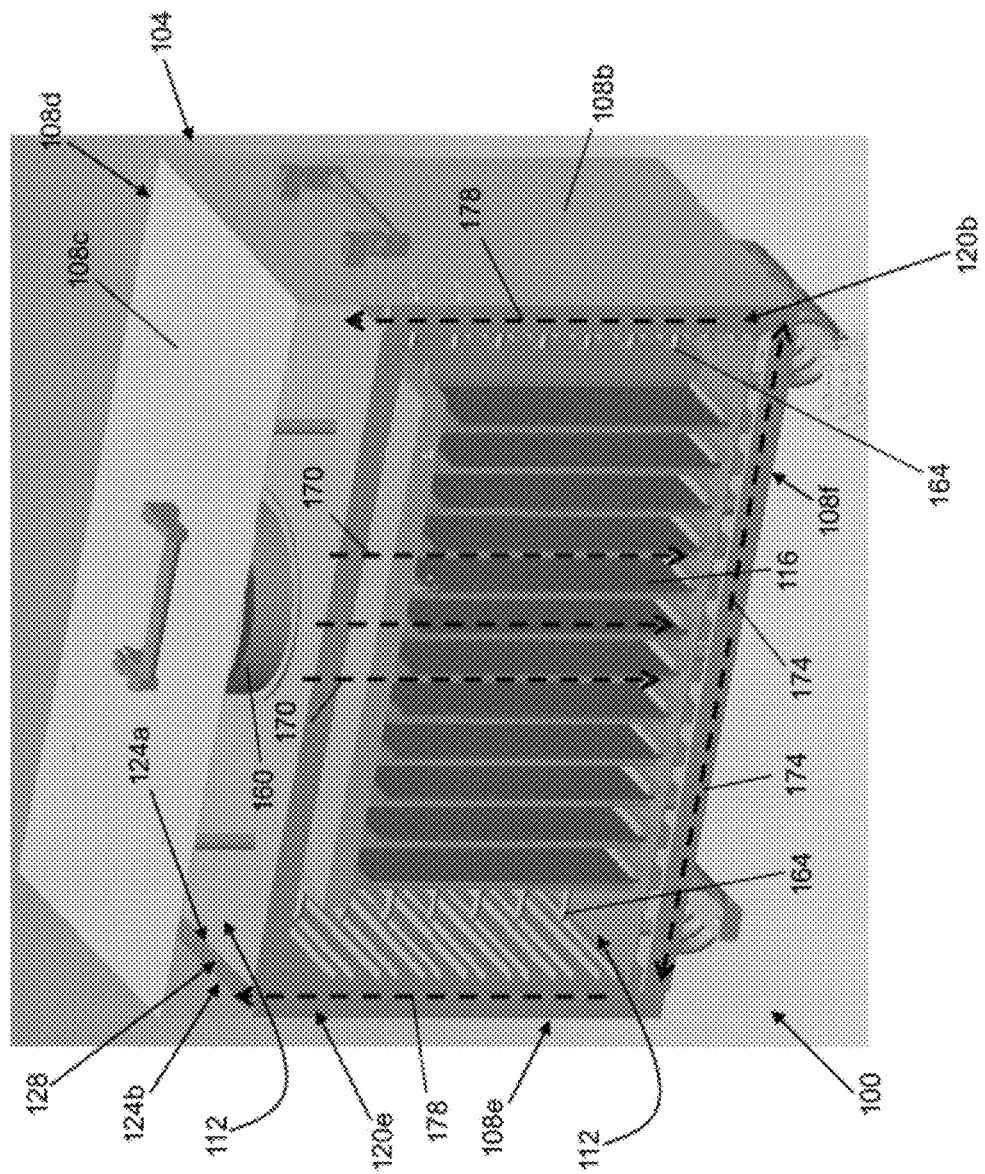
FIG. 1B is a schematic illustration of the enclosure of FIG. 1A with a panel of the enclosure removed.

FIGS. 1A and 1B are schematic illustrations of an enclosure 100, according to an illustrative embodiment. The enclosure 100 includes a box structure 104 that includes a plurality of sides 108 that define a sealed chamber 112. In this embodiment, the box structure includes six sides 108a, 108b, 108c, 108d, 108e and 108f (generally 108). Referring to FIG. 1B, side 108a is removed exposing the sealed chamber 112 within the box structure 104. The chamber 112 contains one or more heat producing components 116 (e.g., electronic components). In this embodiment, the one or more heat producing components are a plurality of microwave modules that transmit and receive microwave signals through side 108a of the box structure 104. Side 108a is a radome panel that is constructed of material that minimally attenuates, or is transparent to, the electromagnetic signals (e.g., radar and radio wave signals) transmitted and received by the microwave modules through side 108a.

In this embodiment, sides 108b and 108e include panels that incorporate a cooling feature into the enclosure 100. Sides 108b and 108e include panels 120b and 120e, respectively (generally 120). Panels 120b and 120e each include two outer sheets sandwiching an inner layer of material between the outer sheets. By way of example, panel 120e includes two outer sheets 124a and 124b. Panel 120e also includes an inner layer of material 128 sandwiched between the two outer sheets 124a and 124b. In alternative embodiments, at least one side 108 of the box structure 104 includes a panel 120. In some embodiments, the box structure 104 includes a plurality of panels 120. In some embodiments, one or more of the plurality of panels act as the load bearing path of the box structure 104.

Figure 2:
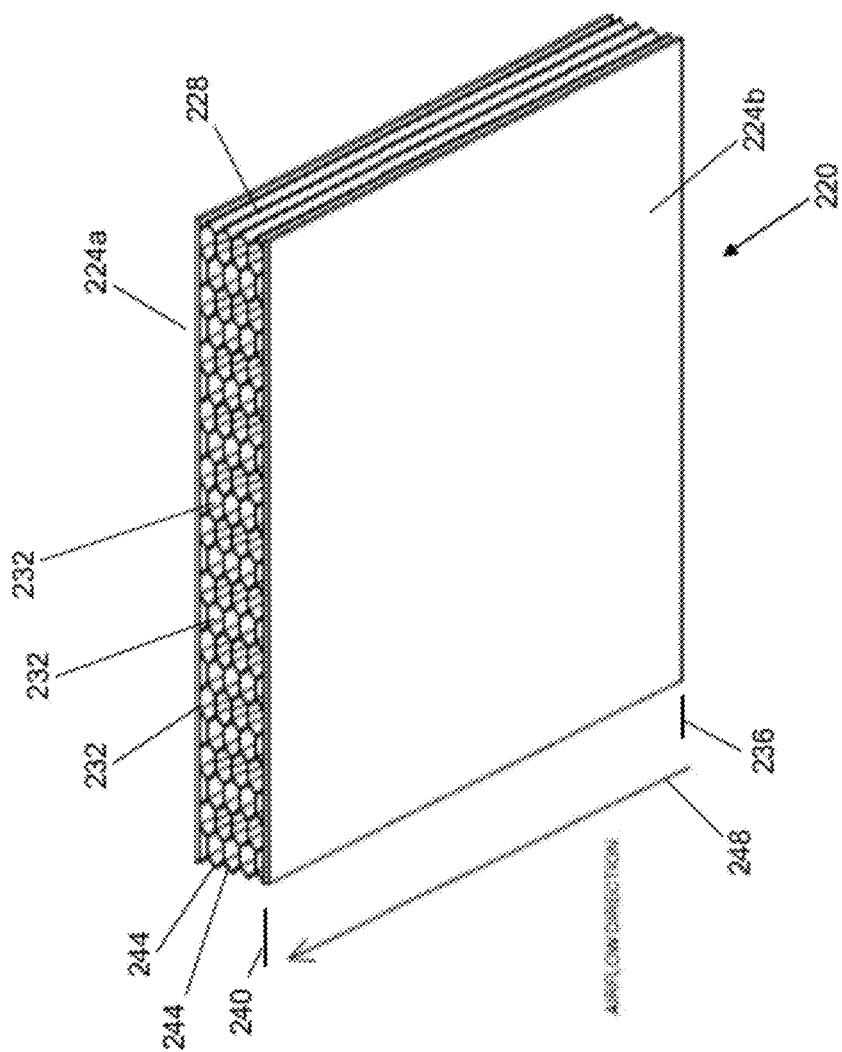
FIG. 2 is a schematic illustration of a panel of the box structure of FIGS. 1A and 1B, according to an illustrative embodiment.

FIG. 2 is a schematic illustration of an exemplary panel 220 of a box structure of an enclosure, according to an illustrative embodiment (e.g., panel 120e of the enclosure 100 of FIGS. 1A and 1B). Panel 220 includes two outer sheets 224a and 224b. Panel 220 also includes an inner layer of material 228 sandwiched between the two outer sheets 224a and 224b. The two outer sheets 224a and 224b and the inner layer of material 228 collectively define a plurality of fluid flow channels 232 extending from a first end 236 of the two outer sheets 224a and 224b to a second end 240 of the two outer sheets 224a and 224b. In some embodiments, the outer sheets 224a and 224b are bonded (or otherwise joined) to the inner layer of material 228. In some embodiments, the two outer sheets 224a and 224b are fabricated using metal and are welded together to form the panel 220. Fluid (e.g., air, nitrogen, argon, coolant fluid) is capable of passing through the fluid channels 232.

In some embodiments, thermally conductive adhesive is used to bond the two outer sheets 224a and 224b to the inner layer of material 228 to, for example, enhance the thermal transfer from the surfaces of the outer sheets 224a and 224b to the fluid flowing through the fluid flow channels 232. In some embodiments, the two outer sheets 224a and 224b and the inner layer of material 228 are fabricated using thermally conductive materials. In this embodiment, the inner layer of material 228 is a honeycomb core that includes a plurality of columnar cells 244 that form the fluid flow channels 232. The lengthwise dimension of the columnar cells 244 are aligned with the direction of travel 248 of the fluid and define the fluid flow channels 232 that extend from the first end 236 to the second end 240 of the panel 220. In some embodiments, the enclosure includes multiple panels and the panels act as the main load bearing path of the box structure of the enclosure. The honeycomb core between the two outer sheets provides a strong, yet lightweight structure.

Referring to FIGS. 1A and 1B, the enclosure 100 also includes a fan 160 within the enclosure 100. The fan 160 blows air within the sealed chamber 112, and in particular, through the fluid flow channels of the panels 120. The enclosure 100 also includes heat pipes 164 that couple the one or more heat producing components 116 to the panels 108b and 108e (i.e., to the outer sheet 124a). The heat pipes 164 transfer heat generated by the heat producing components 116 to the panels 108b and 108e (i.e., to the outer sheet 124a). The panels 108b and 108e then transfer the heat to fluid flowing through the fluid flow channels (e.g., fluid flow channels 232 of FIG. 2). In this embodiment, the fan 160 blows air downwards along path 170 in the sealed chamber 112. When the air reaches the bottom of the enclosure 100 it turns and travels transversely along paths 174. When the air reaches the sides of the enclosure 100 is turns and travels upwards through the fluid flow channels (e.g., fluid flow channels 232) along paths 178. As the air passes through the fluid flow channels 232, heat is transferred to the air.

FIG. 3 is a flowchart 300 of a method for cooling a heat producing component in an enclosure, according to an illustrative embodiment. The method includes placing a heat producing component in a box structure (step 304) that includes a plurality of sides (for example, the plurality of sides 108 of the box structure 104 of enclosure 100 of FIGS. 1A and 1B). The plurality of sides of the enclosure define a sealed chamber. At least one of the sides of the box structure includes a panel, where the panel includes two outer sheets and an inner layer of material sandwiched between the two outer sheets. The two outer sheets and the inner layer of material collectively define a plurality of fluid flow channels extending from a first end of the two outer sheets to a second end of the two outer sheets. Heat generated by the heat producing component is transferred to at least one of the outer sheets.

The method also includes causing or allowing a fluid to flow through the fluid channels (step 308) to transfer heat from at least one of the outer sheets to the fluid flowing through the fluid flow channels. In some embodiments, the enclosure includes a fan and the method includes operating a fan within the sealed chamber to blow a fluid through the fluid flow channels to transfer heat from the at least one of the outer sheets to the fluid flowing through the fluid flow channels. In some embodiments, allowing a fluid to flow through the fluid channels includes allowing natural convection to force fluid flow through the fluid flow channels using buoyancy forces.

In some embodiments, the method also includes transferring heat generated by the heat producing component to the at least one of the outer sheets via heat pipes (step 312). Other methods may be used to transfer heat generated by the heat producing component to at least one of the outer sheets. For example, in one embodiment, thermally conductive material is used to couple the heat producing component to at least one of the outer sheets to transfer the heat.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. An enclosure, the enclosure comprising:
   a box structure comprising a plurality of sides defining a sealed chamber for containing a heat producing component, wherein at least one of the sides of the box structure comprises a panel,
   the panel comprises two outer sheets and an inner layer of material sandwiched between and contacting each of the two outer sheets,
   the two outer sheets and the inner layer of material collectively defining a plurality of fluid flow channels, each of the plurality of fluid flow channels having a lengthwise dimension aligned with the direction of travel of the fluid flow and extending from a first end of the two outer sheets to a second end of the two outer sheets,
   wherein heat generated by the heat producing component is transferred to at least one of the outer sheets which transfers the heat to fluid flowing through the fluid flow channels.

2. The enclosure of claim 1, wherein the panel is a load bearing component of the enclosure.

3. The enclosure of claim 1, comprising a fan within the enclosure to blow air within the sealed chamber.

4. The enclosure of claim 3, wherein the fan blows air through the fluid flow channels.

5. The enclosure of claim 1, wherein the inner layer of material is a honeycomb core comprising a plurality of columnar cells, wherein the walls of the columnar cells define the fluid flow channels extending from the first end of the of the two outer sheets to the second end of the two outer sheets.

6. The enclosure of claim 1, wherein one side of the box structure is a radome panel that is transparent to radar and radio waves.

7. The enclosure of claim 1, comprising a thermally conductive adhesive that adheres the two outer sheets to the inner layer of material.

8. The enclosure of claim 1, comprising heat pipes coupling the heat producing component to the panel to transfer heat generated by the heat producing component to the fluid flowing through the fluid flow channels.

9. The enclosure of claim 1, wherein the two outer sheets and the inner layer of material are fabricated using thermally conductive materials.

10. The enclosure of claim 1, wherein the heat producing component is an electronic component.

11. A method for cooling a heat producing component in an enclosure, the method comprising:

placing a heat producing component in a box structure comprising a plurality of sides defining a sealed chamber, wherein at least one of the sides of the box structure comprises a panel, the panel comprises two outer sheets and an inner layer of material sandwiched between the two outer sheets and contacting each of the two outer sheets, the two outer sheets and the inner layer of material collectively defining a plurality of fluid flow channels, each of the plurality of fluid flow channels having a lengthwise dimension aligned with the direction of travel of the fluid flow and extending from a first end of the two outer sheets to a second end of the two outer sheets, wherein heat generated by the heat producing component is transferred to at least one of the outer sheets.

12. The method of claim 11, comprising operating a fan within the sealed chamber to blow a fluid through the fluid flow channels to transfer heat from the at least one of the outer sheets to the fluid flowing through the fluid flow channels.

13. The method of claim 11, comprising allowing natural convection to force fluid flow through the fluid flow channels using buoyancy forces.

14. The method of claim 11, comprising transferring heat generated by the heat producing component to the at least one of the outer sheets via heat pipes.

15. The method of claim 11, wherein the heat producing component is an electronic component.

* * * * *